(12) United States Patent
Matsui et al.

(10) Patent No.: US 7,402,521 B2
(45) Date of Patent: Jul. 22, 2008

(54) METHOD FOR CHEMICALLY MECHANICALLY POLISHING ORGANIC FILM, METHOD OF MANUFACTURING SEMICONDUCTOR DEVICE, AND PROGRAM THEREFOR

(75) Inventors: Yukiteru Matsui, Yokohama (JP); Gaku Minamihaba, Yokohama (JP); Atsushi Shigeta, Fujisawa (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 11/418,070

(22) Filed: May 5, 2006

(65) Prior Publication Data

US 2007/0000872 A1    Jan. 4, 2007

(30) Foreign Application Priority Data

Jun. 30, 2005    (JP) .............................. 2005-193001

(51) Int. Cl.
*H01L 21/302*    (2006.01)

(52) U.S. Cl. ....................... 438/692; 438/691; 438/693; 156/345.12

(58) Field of Classification Search ................. 439/691, 439/692, 693, 694; 156/345.12, 13; 438/691, 438/692, 693, 694
See application file for complete search history.

(56) References Cited

U.S. PATENT DOCUMENTS

| | | | | |
|---|---|---|---|---|
| 5,597,341 | A * | 1/1997 | Kodera et al. ................... | 451/5 |
| 6,171,514 | B1 * | 1/2001 | Hara et al. ..................... | 216/89 |
| 7,252,782 | B2 * | 8/2007 | Ikeda et al. ................. | 252/79.1 |
| 2002/0072195 | A1 * | 6/2002 | Anma et al. ................. | 438/401 |
| 2002/0193051 | A1 * | 12/2002 | Homma et al. ................. | 451/41 |
| 2004/0253822 | A1 | 12/2004 | Matsui et al. | |

FOREIGN PATENT DOCUMENTS

JP    2004/363191    12/2004

* cited by examiner

*Primary Examiner*—Lan Vinh
(74) *Attorney, Agent, or Firm*—Finnegan, Henderson, Farabow, Garrett & Dunner, L.L.P.

(57) ABSTRACT

There is proposed a polishing method. The method includes feeding a slurry onto a polishing pad, press-contacting a semiconductor substrate held on a polishing head with the polishing pad, the semiconductor substrate having an organic film thereon, and chemically mechanically polishing the organic film by repeating a sequence of rotation and halt of rotation of the polishing pad and the polishing head.

20 Claims, 9 Drawing Sheets

METHOD FOR CHEMICALLY MECHANICALLY POLISHING ORGANIC FILM, METHOD OF MANUFACTURING SEMICONDUCTOR DEVICE, AND PROGRAM THEREFOR

CROSS-REFERENCE TO RELATED APPLICATIONS

This application is based upon and claims the benefit of priority from prior Japanese Patent Application No. 2005-193001, filed Jun. 30, 2005, the entire contents of which are incorporated herein by reference.

BACKGROUND OF THE INVENTION

1. Field of the Invention

This invention relates to a method for chemically mechanically polishing an organic film such as a resist film, to a method of manufacturing a semiconductor device, and to a program for the chemically mechanically polishing.

2. Description of the Related Art

In the process of manufacturing a semiconductor device, a resist film is employed as a sacrificial film for forming a desired structure. For example, subsequent to the formation of a trench in a semiconductor substrate or the formation of a hole in an insulating film, a resist is coated to form a sacrificial film, which is then recessed or partially removed to obtain a desired structure. This method is employed specifically for forming a buried strap for providing an electric connection between a storage node electrode and a cell transistor diffusion region in the manufacture of a semiconductor memory device having a trench capacitor. This method is also useful for preforming, in the process of forming a Cu dual damascene (Cu DD) structure, a via-hole (via first DD).

In either cases, the film thickness of the resist film is required to be uniform throughout a wafer. However, if resist is to be buried in a trench or hole of high patterning density, the volume of resist disposed on a pattern of high density is reduced. Because of this, variability in the order of several hundreds nanometers is generated between the film thickness of the resist film on a pattern of high density and the film thickness of the resist film on a pattern of low density or on a field region.

This variability in film thickness of resist will be further increased in a step of forming a recess which will be executed subsequently, thus degrading the configuration of device and hence resulting in the decrease of depth of focus as well as in the deterioration of yield. With a view to overcome the aforementioned problems due to the variability in film thickness of resist film, there has been proposed a method wherein polishing is performed with a polishing head and a polishing pad being rotated at a low rotational speed of 30 rpm or so. Namely, in the CMP of a hydrophobic film such as a resist film, it is difficult to maintain friction, and, therefore, it is generally difficult to secure a practical polishing speed. Under the circumstances, the polishing is performed at a boundary lubrication region in a Stribeck diagram with a polishing head and a polishing pad being rotated at a low rotational speed, thereby making it possible to retain high friction between a polishing pad and a semiconductor substrate held on a polishing head so as to increase polishing speed and to realize a stable polishing of a resist film within a short period of time. However, even with this conventional method, the improvement of friction is limited.

BRIEF SUMMARY OF THE INVENTION

A polishing method according to one aspect of the present invention comprises feeding a slurry onto a polishing pad; press-contacting a semiconductor substrate held on a polishing head with the polishing pad, the semiconductor substrate having an organic film thereon; and chemically mechanically polishing the organic film by repeating a sequence of rotation and halt of rotation of the polishing pad and the polishing head.

A method for manufacturing a semiconductor device according to another aspect of the present invention comprises forming a recess in a semiconductor substrate or in an insulating film deposited above the semiconductor substrate each employed as an underlying layer; forming a resist film above the underlying layer having the recess; and chemically mechanically polishing the resist film to selectively burying the resist film in the recess; wherein the chemically mechanically polishing of the resist film is performed by: feeding a slurry onto a polishing pad; press-contacting the semiconductor substrate held on a polishing head with the polishing pad, the semiconductor substrate having the resist film thereon; and repeating a sequence of rotation and halt of rotation of the polishing pad and the polishing head.

A program of performing polishing, which is executed by a computer according to another aspect of the present invention comprises a first instruction which causes the computer to press-contact a polishing head holding a semiconductor substrate with a polishing pad being supplied with a slurry; and a second instruction which causes the computer to repeat a sequence of rotation and halt of rotation of the polishing pad and the polishing head being contacted with the polishing pad.

DETAILED DESCRIPTION OF THE INVENTION

Figure 1:
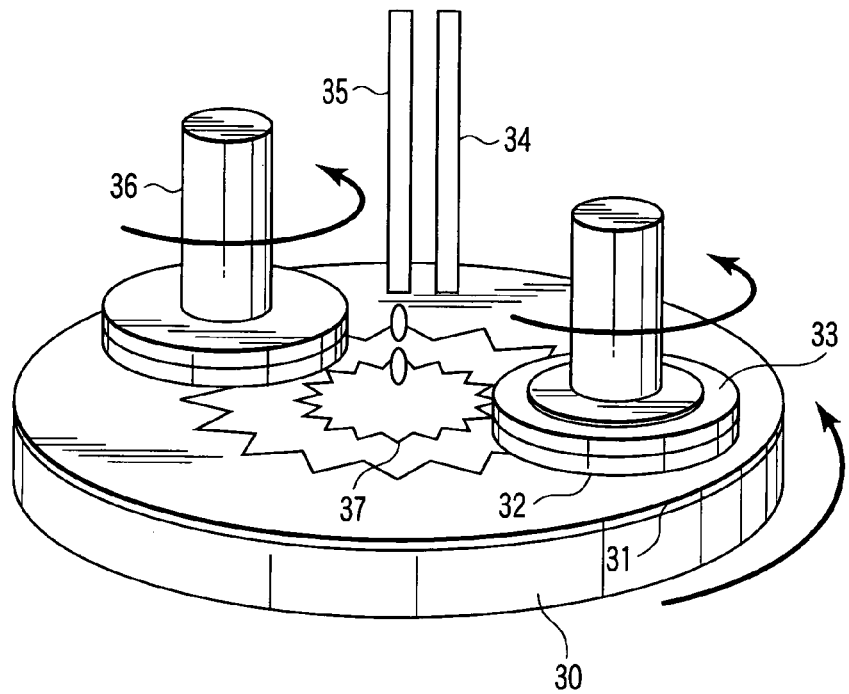
FIG. 1 is a perspective view schematically illustrating a state of CMP.

Next, embodiments of the present invention will be explained.

The present inventors have taken notice of the fact that when the rotational speed is decreased excessively in the conventional chemically mechanically polishing method of an organic film, it is difficult to realize a desired spreading of slurry on a polishing pad by the effect of centrifugal force. Because of this, the polishing rate of the organic film may degrade, thus limiting the possibility of decreasing the rotational speed. For example, if the rotational speed is less than 10 rpm, the aforementioned trend would become more prominent. Incidentally, the rotational speed of 10 rpm is a lower limit of the rotational speed which makes it possible to sufficiently spread a slurry on a polishing pad. Based on this finding, the present inventors have found that in order to stably polish an organic film within a short period of time, it is effective to enhance the friction by taking advantage of static frictional coefficient. In order to take advantage of static frictional coefficient, a sequence of the rotation/halt of rotation of the polishing pad and the polishing head is repeated according to one embodiment of the present invention.

In the chemically mechanically polishing method of an organic film according one embodiment of the present invention, a slurry to be employed for chemically mechanically polishing an organic film includes resin particles. As for the resin particles, it is possible to employ those made of materials selected from the group consisting of methacrylic resin such as polymethylmethacrylate (PMMA), polystyrene (PST) resin, urea resin, melamine resin, polyacetal resin and polycarbonate resin. Among them, PMMA or PST resin is more preferable, since they have a suitable degree of hardness/elasticity for the CMP.

When the primary particle diameter of the resin particles is less than 0.05 μm, the resin particles are liable to enter into a recess where the organic film is buried therein, i.e. a trench formed in a semiconductor substrate or a hole formed in an insulating film, thus inviting a tendency to expand the dishing. On the other hand, when the primary particle diameter of the resin particles exceeds 5 μm, it would become difficult to control the dispersibility of resin particles, thus increasing the possibility of sedimentation of resin particles in the slurry. Therefore, as one embodiment of the present invention, the primary particle diameter of the resin particles should preferably be confined within the range of 0.05 to 5 μm. More preferably, the primary particle diameter of the resin particles should preferably be confined within the range of 0.1 to 3.0 μm.

At least one functional group selected from an anionic functional group, a cationic functional group, an amphoteric functional group and nonionic functional group can be introduced onto the surface of the resin particle. As for the anionic functional group, it is possible to employ, for example, carboxylic acid type, sulfonic acid type, sulfate type, or phosphate type functional group. As for the cationic functional group, it is possible to employ, for example, amine salt type or quaternary ammonium salt type functional group. As for the amphoteric functional group, it is possible to employ, for example, alkanolamide type, carboxybetaine type or glycine type functional group. As for the nonionic functional group, it is possible to employ, for example, ether type or ester type functional group. Among these functional groups, carboxylic group is more preferable because of the easiness of manufacturing the resin particles.

In order to stably disperse the resin particles, the absolute value of ζ-potential should preferably be higher than a predetermined value. More specifically, the absolute value of ζ-potential should preferably be about 20 mV or more. This can be achieved by setting the amount of the functional group to about 0.05 mol/L or more. Incidentally, the ζ-potential can be measured by electrophoresis for instance. Under some circumstances, two or more functional groups may be simultaneously existed on the surface of resin particles. When a functional group exists on the surface of resin particles, it is possible to enhance the dispersibility of resin particles through the electric repulsive force among resin particles without necessitating the addition of a surfactant.

For example, in the case of resin particles having, as a functional group, carboxylic group (COOH) on their surfaces, the carboxylic group dissociates in a slurry as represented by a formula of: $COOH \rightarrow COO^- + H^+$, thus negatively electrostatically charging the surface of resin particles. Therefore, the flocculation among the resin particles can be prevented through the electric repulsive force thereof, thus making it possible to enhance the dispersibility of resin particles and to prolong the life of slurry.

The PMMA particles having carboxylic group (COOH) on their surfaces can be synthesized for example according to the following procedures. First of all, methylmethacrylate, methacrylic acid, divinyl benzene, ammonium lauryl sulfate and ammonium persulfate are placed in a flask together with a sufficient quantity of ion-exchange water. The resultant mixture is then heated up to 70-80° C. with stirring in a nitrogen gas atmosphere, thereby allowing polymerization to take place for 6-8 hours. As a result, it is possible to obtain PMMA particles having a primary particle diameter of about 0.15-0.25 μm and carboxylic group on their surfaces. The primary particle diameter of resin particles can be controlled within the range of 0.05 to 5 μm by modifying the reaction temperature, reaction time and other manufacturing conditions.

The resin particles having, on their surfaces, a functional group as described above are then dispersed in water to obtain a slurry which is useful in the chemically mechanically polishing of an organic film according to one embodiment of the present invention. As for water, it is possible to employ ion-exchange water, pure water, etc. The resin particles should preferably be dispersed in a slurry at a concentration ranging from about 0.01-30 wt %. If the concentration of the resin particles is less than 0.01 wt %, it would become difficult to polish an organic film at a sufficiently high rate. On the other hand, if the concentration of the resin particles exceeds 30 wt %, it may become difficult to secure a sufficient selectivity ratio of the organic film relative to an insulating film having a recess for embedding the organic film and formed by SiN, $SiO_2$ and the like.

If required, an additive such as an oxidizing agent, an organic acid or a surfactant may be incorporated in the slurry at an amount ordinarily employed.

The slurry according to one embodiment of the present invention should preferably be controlled to have a pH ranging from 2 to 8. If the pH of slurry is less than 2, the functional group such as COOH can be hardly dissociated, thus degrading the dispersibility of the resin particles. On the other hand, if the pH of slurry exceeds 8, chemical damage to an organic film such as a resist film may become prominent, thus resulting in increase in dishing.

The pH of the slurry can be adjusted to the aforementioned range by suitably incorporating a pH adjustor into the slurry. As for the pH adjustor, they include for example nitric acid, phosphoric acid, hydrochloric acid, sulfuric acid, citric acid, etc.

Since the slurry for chemically mechanically polishing of an organic film contains resin particles of predetermined particle diameter as described above, it is suited for use in the chemically mechanically polishing of an organic film as one embodiment of the present invention. Especially, when a functional group is existed on the surface of resin particles, it is possible to enhance the dispersibility of resin particles through the electric repulsive force among resin particles without incorporating a surfactant separately. To secure the dispersibility of resin particles is an important factor in terms of polishing properties as well as in viewpoint of storage stability. If resin particles are not sufficiently dispersed, coarse particles may be created thus generating scratch. Otherwise, the slurry may be turned into a hard cake, thus degrading the storage stability. In the case of the aforementioned slurry however, since a functional group exists on the surfaces of resin particles, there is little possibility of generating the aforementioned problems.

Moreover, when the pH of slurry is confined within a predetermined range, it would be possible to sufficiently dissociate the functional group on the surfaces of resin particles without giving any chemical damage to the organic film to be polished.

The polishing of an organic film by using the slurry according to one embodiment of the present invention can be fundamentally performed as follows. As shown in FIG. 1, a slurry 37 is fed from a slurry supply nozzle 35 onto a polishing pad 31 at a flow rate of 100-300 cc/min. At the same time, a polishing head 33 as well as a turntable 30 having the polishing pad 31 attached thereto are rotated at a predetermined rotational speed. In this case, a semiconductor substrate 32 held on the polishing head 33 should preferably be press-contacted with the polishing pad 31 at a polishing load of 200-600 gf/cm$^2$. Further, the rotational speed of the turntable 30 may be selected from the range of 10 to 50 rpm, and the rotational speed of the polishing head 33 may be selected from the range of 5 to 60 rpm. However, the rotational speed of turntable 30 and of the polishing head 33 should preferably be determined so as to enable the relative velocity of the polishing head 33 to the rotational speed of the polishing pad 31 to be confined within the range of 0.17 to 1.06 m/sec. Details of these relationships will be described hereinafter. Incidentally, FIG. 1 also illustrates a water supply nozzle 34 and a dresser 36.

As for the polishing pad, it is possible to employ for example IC1000 (Nitta Haas Co., Ltd.). This IC1000 may be used as supported by Suba 400 (Nitta Haas Co., Ltd.).

Figure 2:
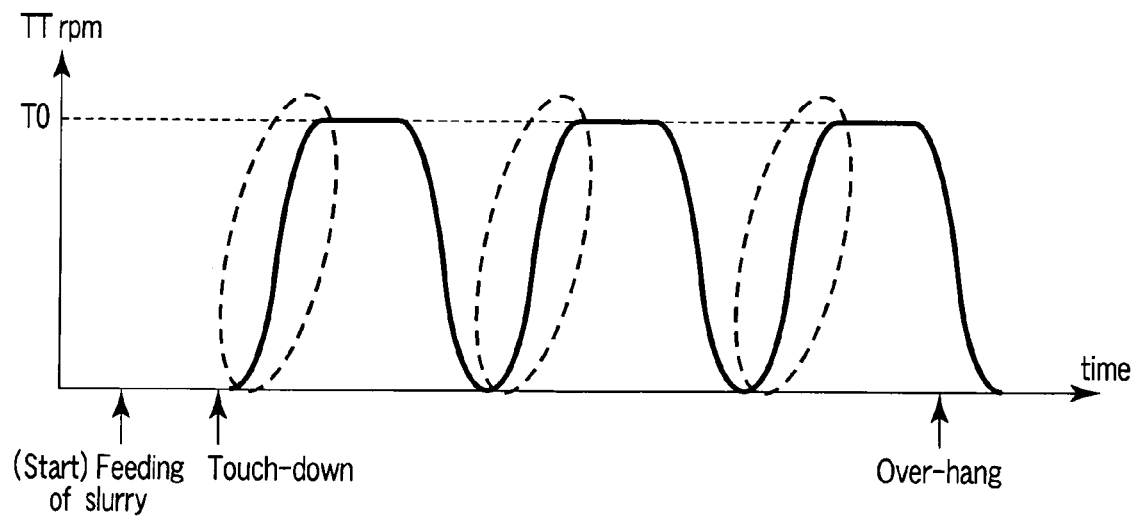
FIG. 2 is a graph showing a sequence in a method according to one embodiment of the present invention.

In one embodiment of the present invention, the polishing of an organic film is performed by taking advantage of static frictional coefficient. Namely, first of all, a slurry is fed dropwise to the polishing pad 31. Then, the semiconductor substrate 32 held on the polishing head 33 is contacted with the polishing pad 31 and applying a predetermined load, thereby press-contacting each other. Then, the polishing pad 31 and the polishing head 33 are respectively rotated so as to increase their rotational speeds to reach a predetermined speed. Although this rotational speed of both polishing pad 31 and polishing head 33 may be maintained for a predetermined period of time, it is preferable that the rotation of both polishing pad 31 and polishing head 33 are halted immediately so as to increase the repetition of rotation thereof in order to fully taking advantage of the static frictional coefficient. Subsequently, the polishing pad 31 and the polishing head 33 are respectively rotated again so as to increase their rotational speeds to reach a predetermined speed. The aforementioned sequence of rotation and halt of rotation is repeated several times before finishing the polishing step. FIG. 2 shows a graph illustrating one example of this sequence.

As shown in FIG. 2, according to the method of one embodiment of the present invention, the rotation of the polishing pad 31 is started after the semiconductor substrate 32 held on the polishing head 33 is contacted with the polishing pad 31 (touchdown) and a polishing load is applied. The rotation of the polishing head 33 is also started after the touchdown of the polishing pad 31. Since the rotation of both polishing head 33 and polishing pad 31 is initiated after the press-contact between the semiconductor substrate 32 held on the polishing head 33 and the polishing pad 31, the effects of static frictional coefficient at the initiation of rotation of both polishing head 33 and polishing pad 31 can be fully utilized, thus making it possible to maintain the friction at a high level. In the sequence shown in FIG. 2, after a predetermined rotational speed has been reached, this rotational speed is maintained for a predetermined period of time, and then, the rotation of both polishing head 33 and polishing pad 31 is halted. Thereafter, the rotation of both polishing head 33 and polishing pad 31 is again started to follow the aforementioned sequence. Since the friction between the semiconductor substrate 32 and the polishing pad 31 is governed by the static frictional coefficient during the period starting from the static states of both polishing head 33 and polishing pad 31 to reach a predetermined rotational speed, it is possible to maintain the friction at a high level by repeating several times the polishing to be governed by this static frictional coefficient. After repeating a predetermined number of times the sequence of rotation and halt of rotation of the polishing head 33 and the polishing pad 31, the polishing head 33 is slid away to such a degree that only a half of the polishing head 33 is contacted with the polishing pad 31, after which both members are separated from each other (over-hanging).

Figure 3:
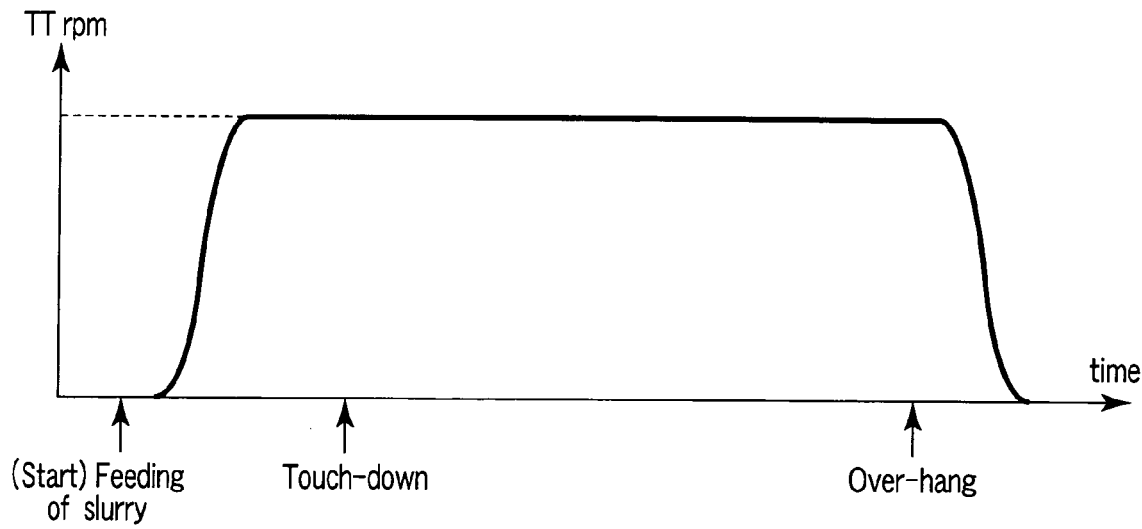
FIG. 3 is a graph showing a sequence in a conventional method.

Incidentally according to the conventional method, after the feeding of a slurry, the polishing head is press-contacted with the polishing pad to perform polishing for a predetermined period of time as represented by a sequence as shown in FIG. 3. More specifically, before the semiconductor substrate held on the polishing head is press-contacted with the polishing pad, the polishing pad is initiated to rotate and when the rotational speed of the polishing pad is increased to a predetermined value, the press-contact of the semiconductor substrate to the polishing pad is initiated while rotating the polishing head, thus applying a load to the polishing head. Since the polishing is performed in this manner, the contact between the polishing pad and the semiconductor substrate held on the polishing head is effected while the polishing pad and the polishing head rotate respectively. Therefore, the friction between the polishing pad and the semiconductor substrate is governed by dynamic frictional coefficient. Since the dynamic frictional coefficient is relatively small as compared with the static frictional coefficient, it is difficult to maintain a high level of friction. Because of this, in the case of the polishing sequence where the dynamic frictional coefficient is exclusively utilized, it is difficult to enhance the friction.

In the case of method according to the embodiment of the present invention, it is possible to maintain a high level of friction due to the utilization of static frictional coefficient. As a result, it is possible to overcome the instability of process such as the generation of the residual resist and hence to enhance the productivity. Furthermore, due to the repetition of the sequence of rotation and halt of rotation of the polishing head and of the polishing pad, the total polishing time can be reduced as compared with the conventional method. As a result, the improvement of throughput is caused.

Figure 4:
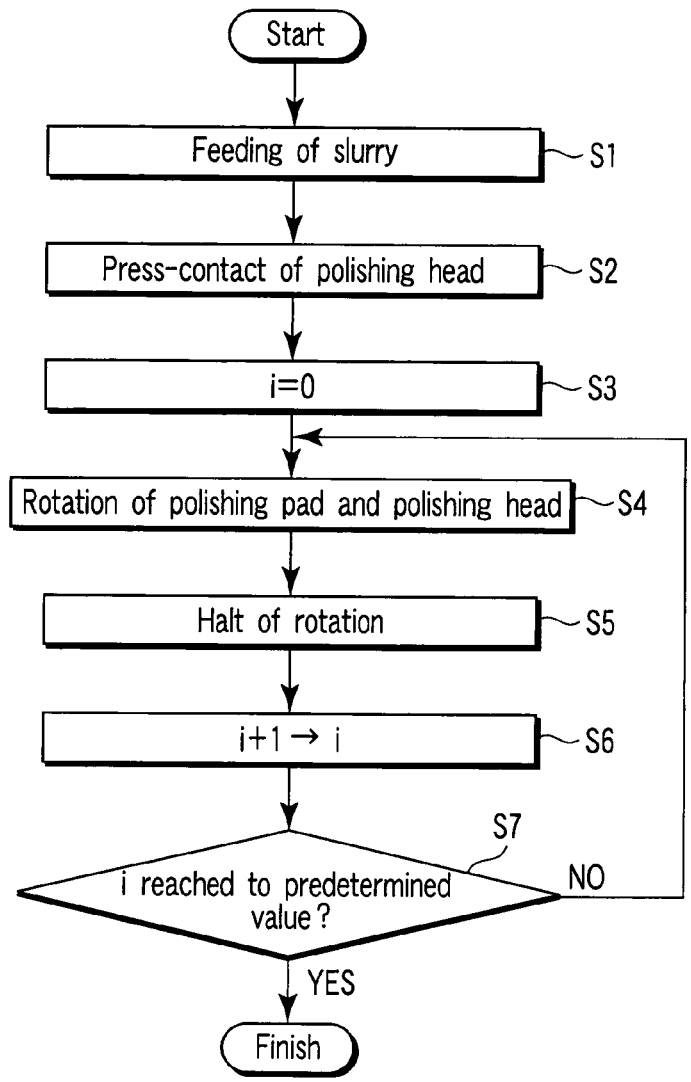
FIG. 4 is a flowchart illustrating a method according to one embodiment of the present invention.
Figure 5:
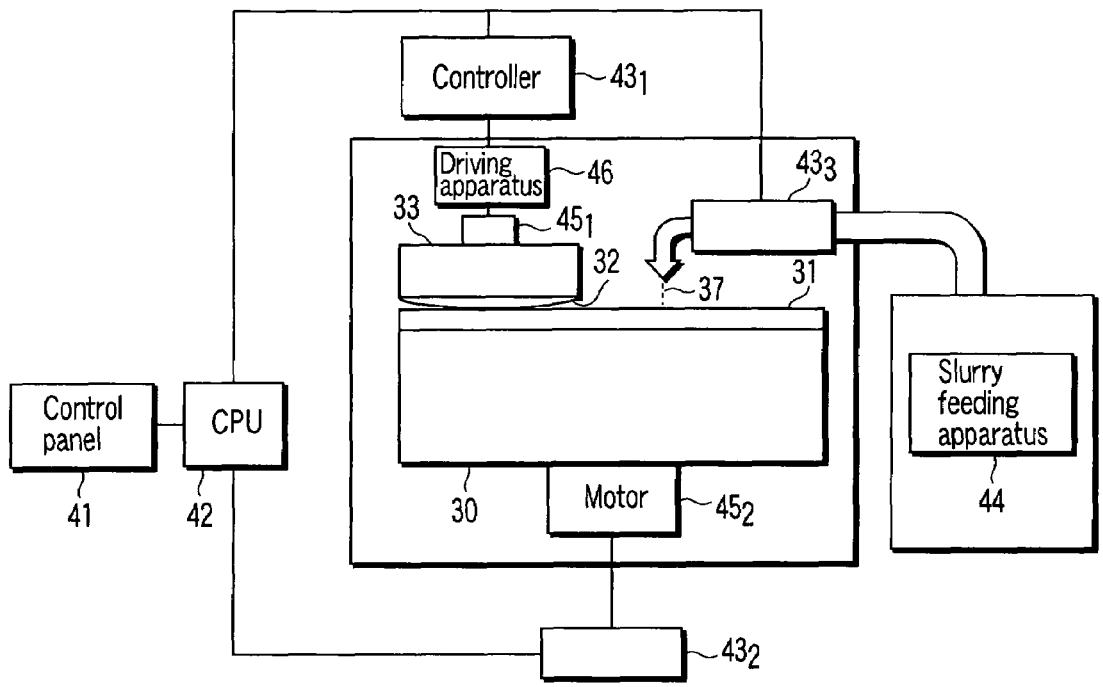
FIG. 5 is a schematic diagram illustrating the construction of a polishing apparatus to be employed in a method according to one embodiment of the present invention.

FIG. 4 shows a flowchart illustrating a program for controlling the method according to one embodiment of the present invention. FIG. 5 shows the construction of polishing apparatus useful in carrying out the method according to one embodiment of the present invention. Next, the method of chemically mechanically polishing an organic film according to one embodiment of the present invention will be explained in detail by referring to these FIGS.

As shown in FIG. 5, a control panel 41 is connected with a CPU 42 having a built-in memory. From this CPU 42, signals are transmitted to controllers $43_1$, $43_2$, $43_3$. The controller $43_1$ not only acts to actuate a driving apparatus 46 so as to move the polishing head 33 up and down but also acts to control the rotation of motor $45_1$ which rotates the polishing head 33. Further, the controller $43_2$ acts to control the rotation of motor $45_2$ which rotates the turntable 30. Furthermore, the controller $43_3$ acts to control the feeding of slurry 37 onto the polishing pad 31 from a slurry supply apparatus 44.

The apparatus is controlled by a program according to one embodiment of the present invention. Namely, this program is executed by a computer and comprises a first instruction which causes the computer to press-contact a polishing head holding a semiconductor substrate with a polishing pad being supplied with a slurry; and a second instruction which causes the computer to repeat a sequence of rotation and halt of rotation of the polishing pad and the polishing head being contacted with the polishing pad. This program can be stored in a memory which is built in a CPU for example. Alternatively, this program may be provided by storing it in a medium such as CD-ROM, etc.

FIG. 4 shows, as a flowchart, a program according to one embodiment of the present invention. First of all, a slurry 37 is fed onto the polishing pad 31 (Step S1). Then, the polishing head 33 holding a semiconductor substrate 32 is press-contacted with the polishing pad 31 (Step S2). The value of "i" is controlled to "0" (i=0) (Step S3). Thereafter, the polishing head 33 is rotated and at the same time, the turntable 30 having the polishing pad 31 attached thereto is rotated (Step S4). Up to the moment when the rotation of the semiconductor substrate 32 and the polishing pad 31 is increased to reach a predetermined rotational speed, the friction between the semiconductor substrate 32 held on the polishing head 33 and the polishing pad 31 is governed by the static frictional coefficient. As already explained above, the rotational speed of the turntable 30 can be confined within the range of 10-50 rpm, and the rotational speed of the polishing head 33 can be confined within the range 5-60 rpm. When the rotation of the polishing head 33 and the polishing pad 31 is increased to reach these predetermined ranges of rotation, the rotation of both polishing head 33 and polishing pad 31 is suspended (Step S5). The rotation of both polishing head 33 and polishing pad 31 at the aforementioned rotational speeds may be continued as long as the period of rotation is limited to less than 180 seconds. If the rotation of both polishing head 33 and polishing pad 31 is continued 180 seconds or more, it would be difficult to secure a sufficient effect of static frictional coefficient.

At the moment when the rotation of both polishing head 33 and polishing pad 31 is halted, the CPU is actuated so as to increase the value of "i" by 1 (Step S6). Therefore, the value of "i" becomes 1 (i=1). Then, in the step S7, judgment is made if the value of "i" has reached to a predetermined value. If the value of "i" is determined as having reached a predetermined value, the polishing is terminated. On the other hand, if the value of "i" is determined as not having reached a predetermined value as yet, the process is returned to the step S4, thus repeating the rotation of both polishing head 33 and polishing pad 31 (Step S4) and the halt of rotation of both polishing head 33 and polishing pad 31 (Step S5). The frequency of the repetition can be determined depending on the quantity removed of the resist.

As already explained above, since the friction between the semiconductor substrate 32 held on the polishing head 33 and the polishing pad 31 is governed by the static frictional coefficient before a predetermined rotational speed is reached starting from the halted states of both polishing head 33 and polishing pad 31, it is possible to maintain the friction at a high level by repeating the polishing to be governed by this static frictional coefficient.

In one embodiment of the present invention, since the polishing is performed according to the aforementioned sequence, the polishing of an organic film such as a resist film can be executed stably and within a short period of time.

Next, the polishing conditions of the CMP of resist according to one embodiment of the present invention will be explained further in detail.

In the CMP of resist, the removal of the resist film is mainly proceeded through the peeling of the resist film by the effects of mechanical polishing force of the polishing pad or abrasive particles. In the CMP where this mechanical factor is very strong, it is very important to maintain the friction between the wafer having the resist film and the polishing pad at a high level in order to obtain a high polishing rate.

In the ordinary CMP such as $SiO_2$-CMP, not only the surface of the polishing pad but also the surface to be polished is hydrophilic. Therefore, the frictional coefficient between these surfaces during the polishing will fall within a boundary lubrication region of so-called Stribeck graph if the rotational speed of the polishing pad is confined within a practical range. Therefore, as the rotational speed of the polishing pad is increased, the polishing rate tends to increase according to the ordinary Preston equation.

Figure 6:
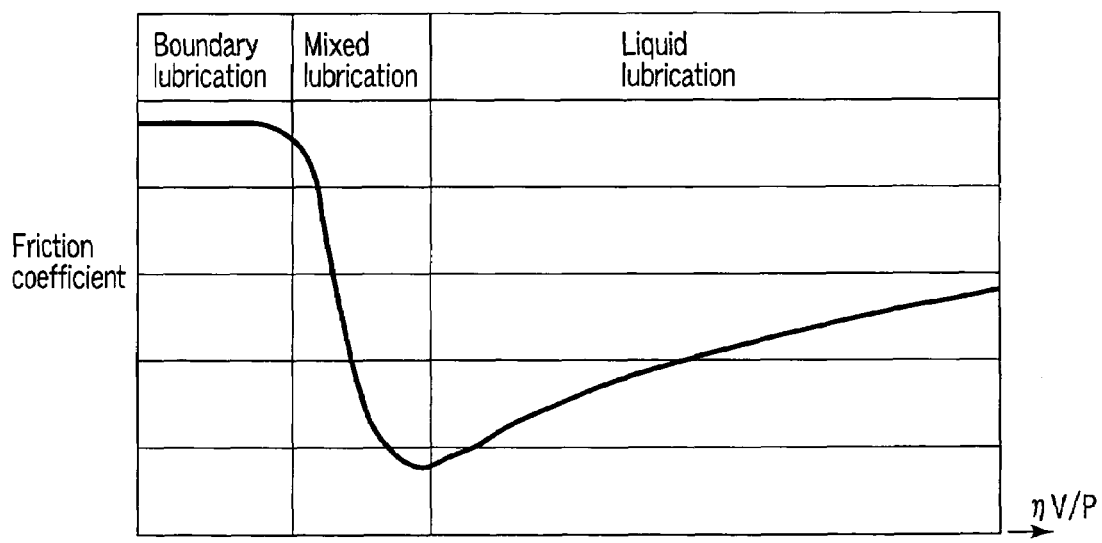
FIG. 6 is a graph showing Stribeck graph.

Followings are explanations on these features which are set forth with reference to the Stribeck graph shown in FIG. 6. In the graph of FIG. 6, the abscissa represents load characteristics, η denotes the viscosity of slurry, V a relative velocity and P a polishing pressure. Further, the ordinate represents a frictional coefficient (arbitrary unit).

In the case of $SiO_2$ for example, a wide range of the rotational speed of the polishing pad which ranges from 10 to 100 rpm would fall within the boundary lubrication region, thus making it possible to secure a sufficiently large frictional coefficient. Incidentally, if the rotational speed of the polishing pad is less than 10 rpm, it would be impossible to sufficiently disperse or spread a slurry over the polishing pad. If the rotational speed of the polishing pad exceeds 100 rpm, a risk of causing a wafer to run away from the polishing head would be increased. When it is calculated assuming that the distance R between the center of polishing pad and the center of wafer is 170 mm, the relative velocity of wafer would become 0.17 m/sec and 1.57 m/sec, respectively, if the rotational speed of polishing pad is set as described above.

Whereas, in the case of the CMP where a resist film, a hydrophobic material, is to be polished, as the relative velocity of wafer is lowered, the polishing rate would become higher. The reason for this may be ascribed to the fact that due to the shavings of resist, the surface of polishing pad becomes hydrophobic after the polishing step. Since not only the surface of polishing pad but also the surface of wafer is turned hydrophobic, the frictional coefficient would be sharply decreased as the relative velocity is increased to a certain degree. This condition corresponds to the liquid lubrication region in the Stribeck graph shown in FIG. 6. In this case, the contact between a wafer and the polishing pad would become a state of almost zero and hence the polishing rate of the resist film would become very small.

In the CMP of resist film to be performed according to the sequence shown in FIG. 2, the influence of the relative velocity on the state of friction was investigated by changing the rotational speed $\Omega$ of the polishing pad and by using a 200 mm wafer with the distance R between the center of polishing pad and the center of wafer being set to 170 mm. The relative velocity in this case was a value which was taken at the moment when the rotational speed of the polishing head as well as the polishing pad became maximum. As a result, it was found that when the rotational speed of the polishing pad is confined within the range of 10 to 60 rpm, it would fall within the boundary lubrication region and when the rotational speed thereof is 70 rpm or more, it would fall within the liquid lubrication region. In order to achieve the CMP of resist within the boundary lubrication region, the relative velocity of wafer V should be set to the range of 0.17 to 1.06 m/sec.

Figure 7:
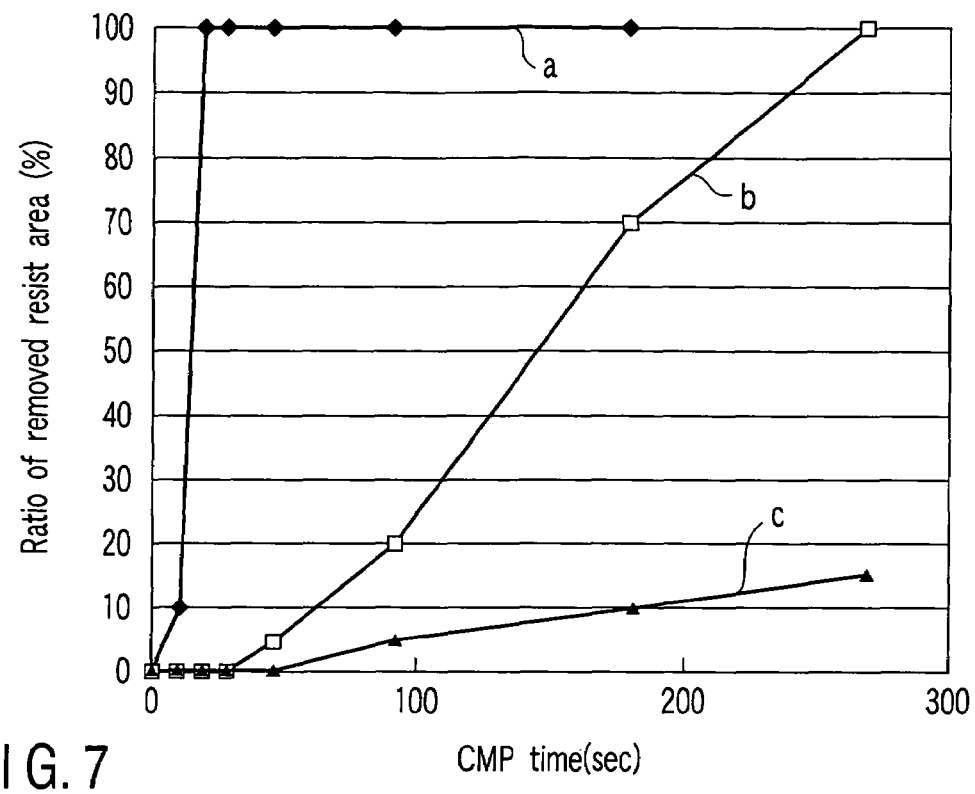
FIG. 7 is a graph showing the relationship between CMP time and the ratio of removed resist area.

Next, the relationship between the time of CMP and the ratio of removed resist area as the relative velocity of wafer is changed as described above will be explained with reference to FIG. 7. In this case, the "ratio of removed resist area" is defined such that a state before CMP where the resist film exists on the entire surface is assumed as 0% and a state after finishing the CMP where the resist is completely removed is assumed as 100%. Herein, the ratio of removed resist area was investigated by polishing a resist film having a thickness of 3 μm by the conventional polishing method. In the graph of FIG. 7, three results differing in relative velocity of wafer are illustrated. Curves "a", "b" and "c" show results obtained when the relative velocity of wafer was 0.53, 1.24 and 1.57 m/sec, respectively. Incidentally, the rotational speed of polishing pad on the occasion of each of these relative velocities was 30, 70 and 100 rpm, respectively. As described above, when the CMP of resist is performed with the rotational speed of the polishing pad being set to 70 rpm or more, i.e. a relative velocity of 1.24 m/sec or more, the friction coefficient become smaller, thus entering into the liquid lubrication region of Stribeck graph. Therefore, as shown by the curve "b", it will take a long time of 270 sec or more in order to accomplish the CMP, thus indicating a very low polishing rate.

Whereas, when the CMP of resist is performed with the rotational speed of the polishing pad being set to 30 rpm, i.e. a relative velocity of 0.53 m/sec, the friction can be maintained at a high level since the friction coefficient falls within the region of boundary lubrication. Thus, as indicated by the curve "a", the polishing can be accomplished taking only 20 seconds or so.

Incidentally, as indicated by the curve "c", when the polishing is performed at a relative velocity of 1.57 m/sec falling within the liquid lubrication region, the ratio of removed resist area was only 15% or so at the moment when the polishing was continued for 270 seconds.

Figure 8:
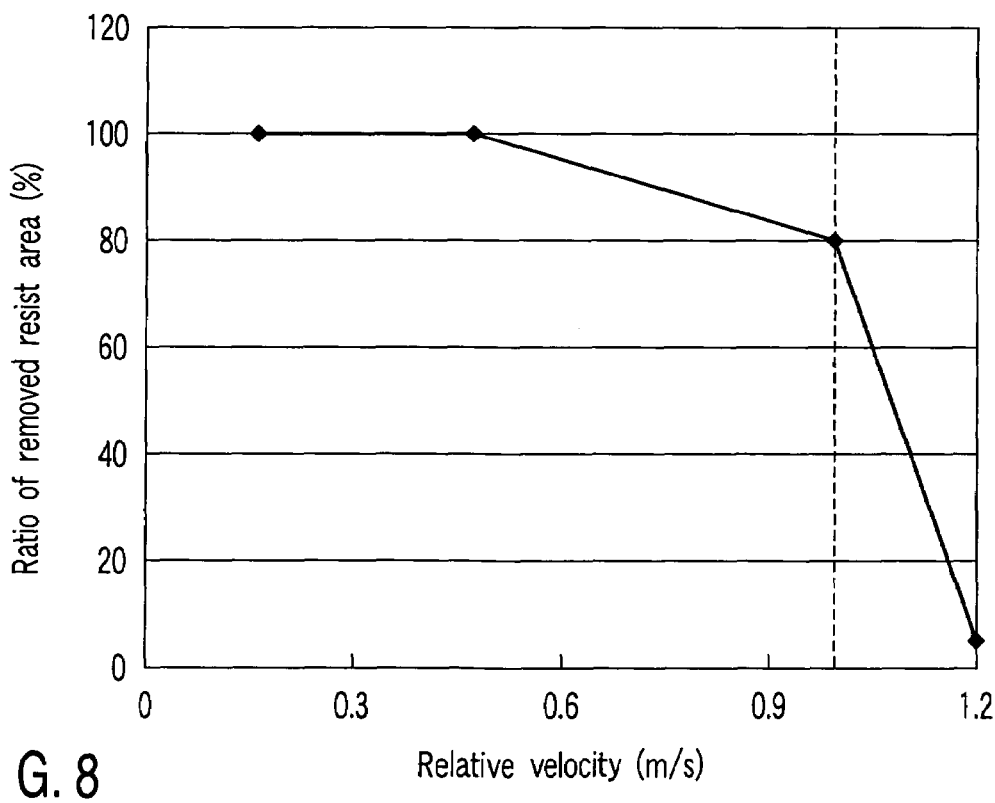
FIG. 8 is a graph showing the relationship between relative velocity and the ratio of removed resist area.

The graph of FIG. 8 illustrates the relationship between the relative velocity and the ratio of removed resist area as the polishing was performed for 45 seconds. As long as the relative velocity is confined within the range of 0.17 to 1.06 m/sec, it is possible to achieve 80% or more in ratio of removed resist area by performing the polishing for 45 seconds.

Therefore, in the method according to one embodiment of the present invention, when the relative velocity of wafer at the moment when the rotational speed of the polishing head as well as the polishing pad became maximum is confined within the aforementioned range, it is possible to secure a sufficient level of frictional coefficient even in a time period where the polishing is performed with the rotational speed of the polishing head and the polishing pad being maintained at a predetermined rotational speed. As a result, the polishing rate can be further enhanced.

Incidentally, in order to secure a sufficient polishing rate, the load during the CMP should preferably be confined within the range of 200 to 600 gf/cm$^2$. If the load is less than 200 gf/cm$^2$, the friction coefficient would be liable to fall within the liquid lubrication region of Stribeck graph, thus making it difficult to maintain desired friction. On the other hand, if the load is higher than 600 gf/cm$^2$, it would become difficult to feed a slurry onto the surface to be polished, thus degrading the polishing rate and increasing the quantity of scratch.

In the CMP of an organic film according to one embodiment of the present invention, the resist will be buried in a trench formed in an underlying layer such as a semiconductor substrate or an insulating film. Therefore, the particle diameter of resin particles to be employed in a slurry should preferably be selected depending on the opening diameter of the trench. The features of the resin particles will be explained in detail as follows.

Figures 9A, 9B:
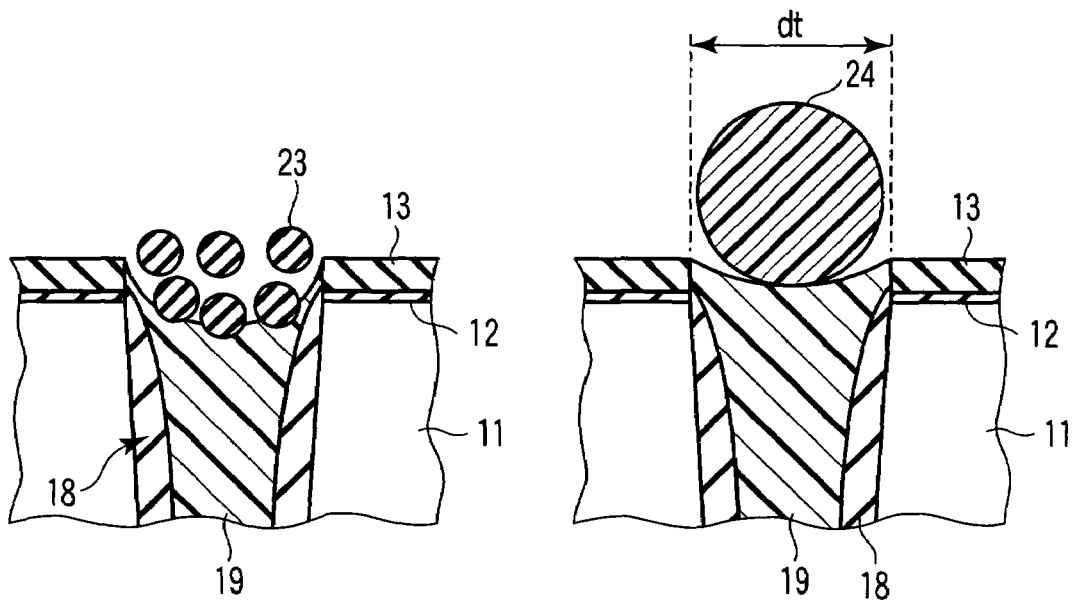
FIGS. 9A and 9B show respectively a cross-sectional view schematically illustrating a state of abrasive particle at a trench portion.

FIGS. 9A and 9B show states of abrasive particles in a trench portion. The opening diameter $d_t$ of the trench is set to 2 μm. Incidentally, FIGS. 9A and 9B represent a step of forming a buried strap as described hereinafter, wherein a Pad oxide film 12 and Pad nitride film 13 are successively formed on a semiconductor substrate 11. A collar oxide film 18 is formed on the sidewall inside the trench formed in this semiconductor substrate 11. A resist film 19 is buried in this trench by CMP using a slurry.

For example, when a slurry containing 1 wt % of silica particles having a primary particle diameter of 0.035 μm is employed, the size of silica particles is much smaller than the diameter of the trench. Therefore, as shown in FIG. 9A, the silica particles enter into the trench, thus proceeding the dishing. On the other hand, when the resin particles 24 which are relatively large in size are employed, the resin particles 24 can hardly enter into the trench, thus not proceeding the dishing as shown in FIG. 9B.

Figure 10:
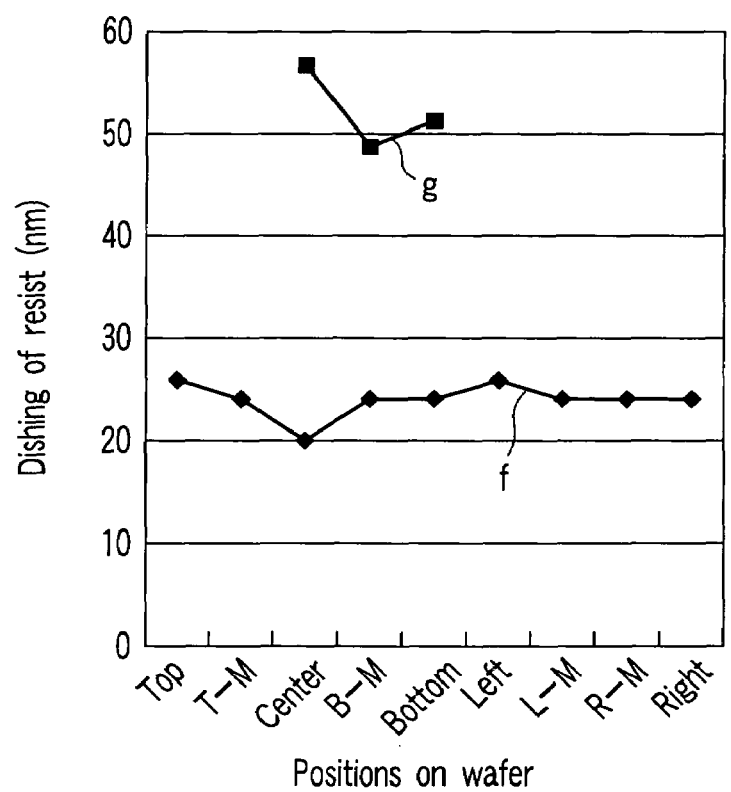
FIG. 10 is a graph showing the relationship between the position of wafer and the magnitude of dishing.

The relationship between the position of wafer and the magnitude of dishing in each case of FIGS. 9A and 9B is shown in the graph of FIG. 10. In FIG. 10, the curves "f" and "g" represent the relationship of FIGS. 9B and 9A, respectively. As indicated by the curve "g", when silica particles which are relatively small in particle diameter are employed, the dishing of resist would exceed 50 nm and in-plane uniformity would be degraded. Further, the configuration of dishing would be distorted, thereby degrading the configuration of resist after the recessing thereof. Moreover, the silica particles that have been entered into the trench cannot be readily removed, thus easily remaining the silica particles in the trench. In this case, the residual silica particles become a mask on the occasion of recessing the resist, thus leading to a cause for the non-uniformity in depth of recess.

On the other hand, in the case of using resin particles which are relatively large in diameter, the magnitude of dishing can be suppressed to 25 nm or so as indicated by the curve "f". Even if the resin particles remain in the trench, they can be removed by recessing (chemical dry etching (CDE)), since the resin particles are formed of the same kind of organic material as that of the resist. Therefore, any risk due to residual resin particles would be negligible. Further, the abrasive force of the resin particles to SiN film is also minimal, so that the polishing rate of SiN film can be advantageously suppressed to 1/10 of that of silica particles.

Figure 11:
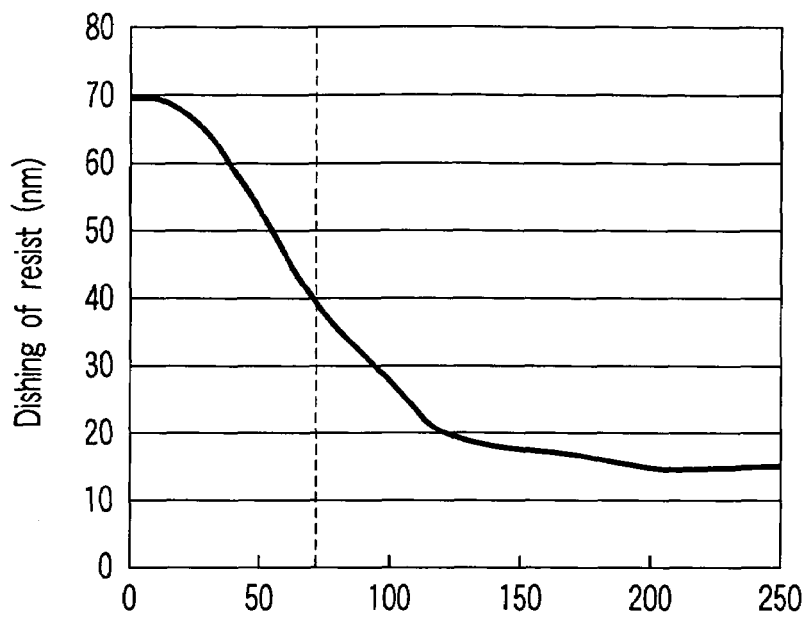
FIG. 11 is a graph showing the relationship between a ratio of particle size/trench size and the magnitude of dishing.

FIG. 11 illustrates the relationship between the ratio of particle size/trench size and the magnitude of dishing. If the magnitude of dishing is confined to about 40 nm at most, it would not substantially affect the process of manufacturing a semiconductor device and hence it would be acceptable. Therefore, the ratio of particle size/trench size should preferably be 70% or more. If the ratio of particle size/trench size becomes higher than 200%, the magnitude of dishing can be confined to a constant level of about 15%. Further, because of the reason explained above, the primary particle diameter of the resin particles should be limited to 5 μm or less. It is preferable to determine the upper limit of the ratio of particle size/trench size by taking these matters into consideration.

Figure 12:
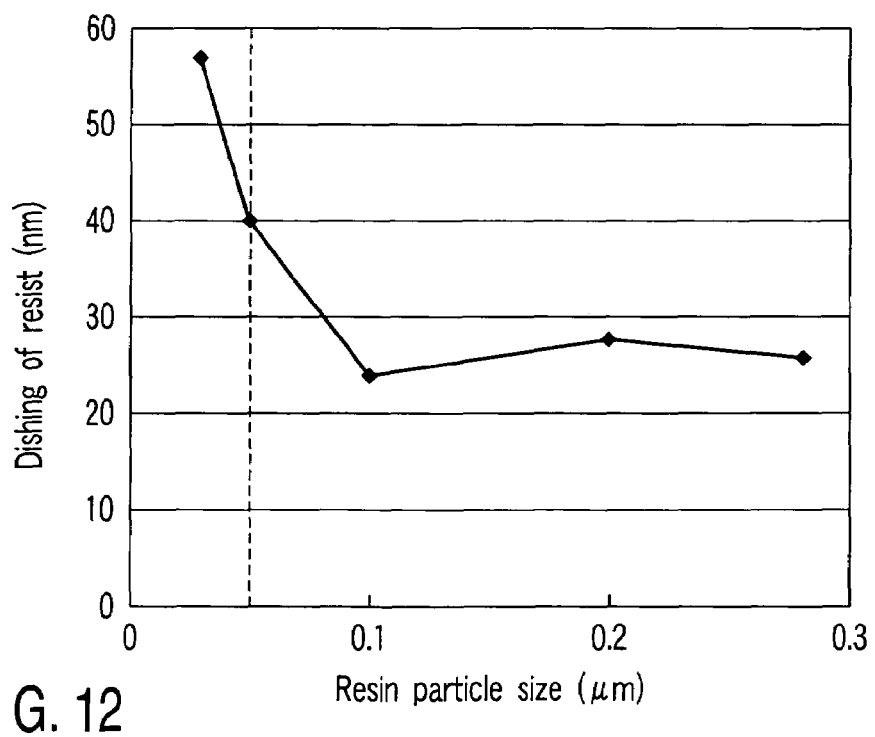
FIG. 12 is a graph showing the relationship between abrasive particle size and the magnitude of dishing.

FIG. 12 illustrates the relationship between the size of resin particles and the magnitude of dishing. The size herein is of primary particle diameter, and hence, if this size is 0.05 μm or more, the magnitude of dishing can be suppressed to 40 nm or less.

As explained above, by using the method according to one embodiment of the present invention, it is now possible to fabricate, within a short period of time, a buried structure of resist which is small in magnitude of dishing and in non-uniformity of dishing. Moreover, it is possible to avoid the generation of residual residue, thus enhancing the stability of process. Therefore, when the method according to one embodiment of the present invention is applied to the fabrication of buried straps, non-uniformity of electric resistance can be greatly minimized.

Next, one embodiment of the present invention will be explained with reference to the process of forming a buried strap for electrically connecting a storage node electrode with a diffusion region of cell transistor.

FIGS. 13 to 21 illustrate a method of forming a buried strap.

Figure 13:
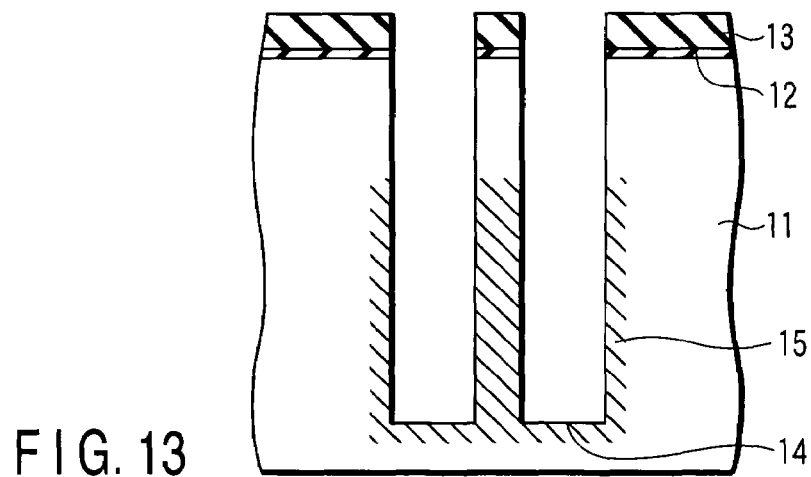
FIG. 13 is a cross-sectional view of a step illustrating the method of manufacturing a semiconductor device according to one embodiment of the present invention.
Figure 14:
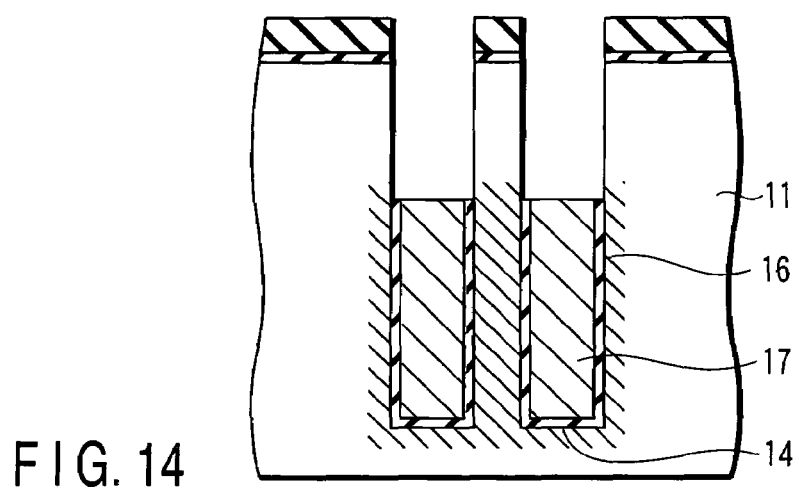
FIG. 14 is a cross-sectional view of a step following the step shown in FIG. 13.

First of all, as shown in FIG. 13, by photolithography and dry etching method, trenches 14 as recesses are formed in a semiconductor substrate 11 having a Pad oxide film 12 and a Pad nitride film 13 successively deposited in advance thereon. The diameter of these trenches 14 is 0.14 μm and the depth thereof is 1 μm. A lower portion of each of these trenches 14 is diffused with an n-type impurity, thus forming a buried plate electrode 15.

A capacitor dielectric film 16 is then deposited on the inner circumferential wall of the buried plate electrode 15 formed as described above. Further, an As-doped polysilicone film (hereinafter referred to as storage node) 17 to be subsequently fabricated into a storage node electrode is deposited on this capacitor dielectric film 16. As a result, the trenches 14 are filled with this storage node 17. Then, this storage node 17 is back-etched to a desired depth, and by using a solution such as $H_3PO_4$, the capacitor dielectric film 16 exposed on the sidewall of the trench 14 is etched away to obtain a structure shown in FIG. 14. Subsequently, a thermal oxide film (not shown) is formed on the surface of the semiconductor substrate.

Figure 15:
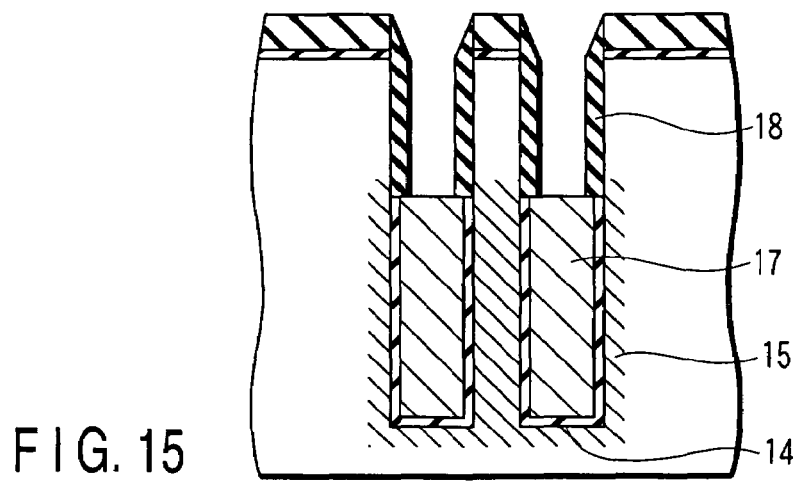
FIG. 15 is a cross-sectional view of a step following the step shown in FIG. 14.

Further, as shown in FIG. 15, a collar oxide film 18 is deposited on an upper inner wall of the trench 14 where the storage node 17 is not filled. This collar oxide film 18 functions to electrically insulate the buried plate electrode 15 from the diffusion region (not shown) of cell transistor. Thereafter, in order to provide an electric contact between a polysilicone film (to be explained hereinafter) and the storage node 17, the collar oxide film 18 deposited on the storage node is removed by dry etching method.

Figure 16:
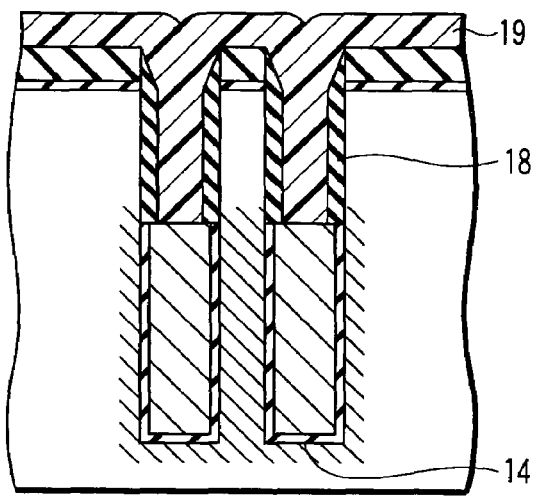
FIG. 16 is a cross-sectional view of a step following the step shown in FIG. 15.
Figure 17:
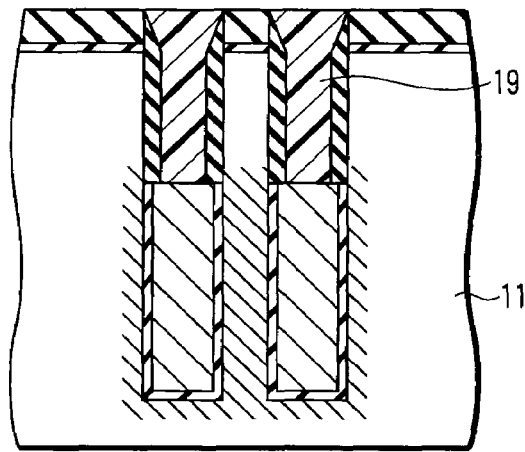
FIG. 17 is a cross-sectional view of a step following the step shown in FIG. 16.

Then, as shown in FIG. 16, a resist (IX405, available from JSR) is coated on the entire surface to form a resist film 19 having a film thickness of 3 μm. Subsequently, this resist film 19 is subjected to CMP to planarize thereby exposing the surface of Pad nitride film 13 as shown in FIG. 17. In this polishing of the resist film 19, the method according to one embodiment of the present invention has been utilized.

Specifically, by using IC1000 as a polishing pad, the polishing was performed as described above. First of all, as shown in FIG. 1, a slurry 37 was fed drop-wise onto the polishing pad 31 from the slurry supply nozzle 35 at a flow rate of 150 cc/min.

The slurry employed herein was prepared according to the following recipe. First of all, 92 parts by weight of styrene, 4 parts by weight of methacrylic acid, 4 parts by weight of hydroxyethyl acrylate, 0.1 parts by weight of ammonium lauryl sulfate, 0.5 parts by weight of ammonium persulfate and 400 parts by weight of ion-exchange water were placed in a 2 L flask. The resultant mixture was then heated up to 70° C. with stirring in a nitrogen gas atmosphere, thus allowing polymerization reaction to take place for 6 hours. As a result, PST particles having a primary particle diameter of 0.2 μm and carboxyl group were obtained. The PST particles were then dispersed in pure water at a concentration of 1 wt % and nitric acid was added thereto to adjust the pH thereof to 3, thus obtaining the slurry. Since the diameter of the trench 14 formed in the semiconductor substrate was 0.14 μm, the primary particle diameter of the resin particles included in the slurry was about 140% of the diameter of trench 14.

Subsequent to the feeding, in drop-wise, of the slurry onto the polishing pad 31, the polishing head 33 holding the semiconductor substrate 32 was press-contacted with the polishing pad 31 at a load of 500 gf/cm². Then, the polishing pad 31 and the polishing head 33 were started to rotate, achieving a rotational speed of 30 rpm taking 3 seconds. The polishing with this rotational speed of 30 rpm was continued for 30 seconds. Then, the rotation of the polishing pad 31 and the polishing head 33 was halted taking 3 seconds. This sequence of the rotation and the halt of rotation was repeated twice, thereby accomplishing the polishing taking a total polishing time of 72 seconds.

It was confirmed, through the observation using a cross-sectional SEM after finishing the polishing, that the resist film 19 was satisfactorily buried in the trenches, leaving no resist on the Pad nitride film 13. If the resist is remain on the Pad nitride film, the productivity would be degraded due to the reworking and, at the same time, the stability of process would be degraded. Whereas, in the case of the method according to one embodiment of the present invention, these problems can be overcome. Further, since the dishing on the surface of resist film 19 can be sufficiently suppressed, it would be advantageous in view-point of reducing the non-uniformity of film thickness of the resist after the recessing step of resist to be performed subsequent to the CMP.

Figure 18:
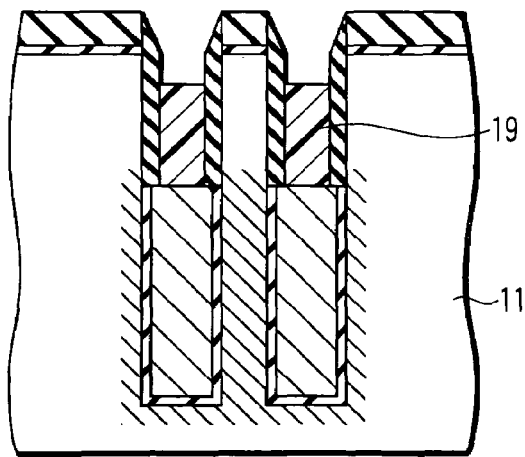
FIG. 18 is a cross-sectional view of a step following the step shown in FIG. 17.

Thereafter, as shown in FIG. 18, the recessing of the resist film 19 by CDE method down to a depth as desired is performed in order to make an electric contact with the diffusion region (not shown) of cell transistor.

Figure 19:
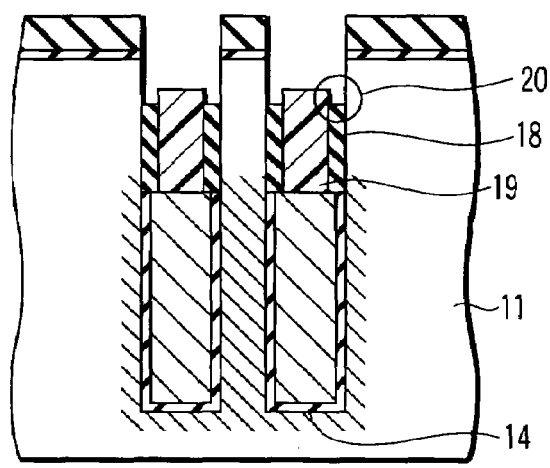
FIG. 19 is a cross-sectional view of a step following the step shown in FIG. 18.

By wet etching method, a part of the collar oxide film 18 is removed as shown in FIG. 19, thus exposing a portion of the semiconductor substrate 11 in the trenches 14. The top surface of the collar oxide film 18 is located lower than the top surface of the resist film 19 as shown in FIG. 19, thus forming an opening 20 of the buried strap.

Figure 20:
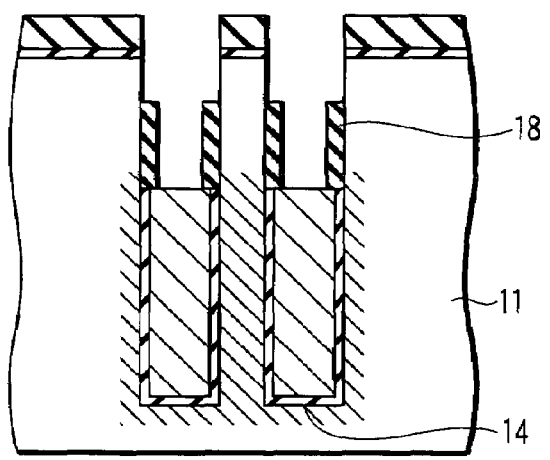
FIG. 20 is a cross-sectional view of a step following the step shown in FIG. 19.
Figure 21:
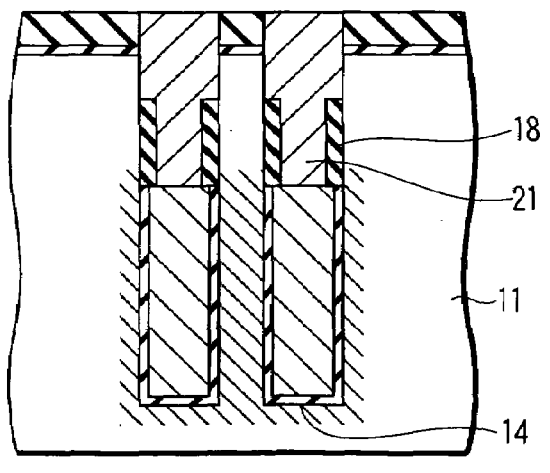
FIG. 21 is a cross-sectional view of a step following the step shown in FIG. 20.

After the resist film 19 has been removed as shown in FIG. 20, a polysilicon film 21 is deposited in order to secure an electric contact between the diffusion region (not shown) of cell transistor and the storage node 17 as shown in FIG. 21. As a result, the opening 20 of the buried strap is filled with this polysilicon film 21, thus forming a buried strap.

Since the recessing is performed subsequent to the step of planarizing the resist film 19 without generating the residue of resist, the resist film can be recessed with a uniform depth. Therefore, there is no possibility of generating non-uniformity in film thickness of the collar oxide film 18 after the etchback step by wet etching method. Moreover, since the generation of residual resist after the polishing of the resist film 19 can be prevented, it is possible to omit the re-working thereof, thus enhancing the productivity. As a result, the stability of process can be also enhanced.

Incidentally, since the recessing is performed subsequent to the step of planarizing the resist film 19, the resist film can be recessed with a uniform depth by using the method according to one embodiment of the present invention. Therefore, there is no possibility of generating non-uniformity in film thickness of the collar oxide film 18 after the etchback step. Any non-uniformity in film thickness of the collar oxide film 18 would invite non-uniformity in electric resistance of the buried strap, causing the deterioration of yield. Whereas, according to the method representing one embodiment of the present invention, the non-uniformity in film thickness of the collar oxide film 18 at the buried strap can be minimized to a maximum extent.

For the purpose of comparison, the resist film 19 was polished according to the conventional method to form a buried strap. More specifically, by following the sequence shown in FIG. 3, the polishing of a resist film was performed continuously for a predetermined time without repeating the rotation/halt of rotation of the polishing head and the polishing pad. The polishing time after the touch-down was set to 180 seconds and other conditions such as the polishing load of the polishing head, the rotational speed of the polishing head and turntable, etc. were made the same as those described above. When the surface that had been polished was observed visually and also by an optical microscope, it was possible to confirm the residue of resist on the Pad nitride film. This residual resist would become a cause for generating non-uniformity of film thickness in a subsequent recessing step as well as a cause for inviting the instability of process.

By using the method according to one embodiment of the present invention, it is possible to prevent the generation of residual resist and to realize a CMP process of resist which is excellent in stability of process. Incidentally, the polishing method according to one embodiment of the present invention can be applied to a photo-resist film and an organic film such as an organic SOG, making it possible to obtain almost the same effects in this case also.

According to one aspect of the present invention, it is possible to provide a method of chemically mechanically polishing an organic film such as a resist film in a stable manner and within a short period of time. According to another aspect of the present invention, it is possible to provide a method of manufacturing a semiconductor device, which is capable of forming a buried structure of resist which is excellent in planarity and uniformity. According to a further aspect of the present invention, it is possible to provide a program for controlling a method of chemically mechanically polishing an organic film such as a resist film in a stable manner and within a short period of time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
   feeding a slurry onto a polishing pad;
   press-contacting a semiconductor substrate held on a polishing head with the polishing pad, the semiconductor substrate having an organic film thereon; and
   chemically mechanically polishing the organic film by repeating a sequence of rotation and halt of rotation of the polishing pad and the polishing head while feeding the slurry on the polishing pad, during repeating the sequence, the semiconductor substrate being kept press-contacted with the polishing pad.

2. The method according to claim 1, wherein the press-contacting the semiconductor substrate with the polishing pad is executed at a pressure ranging from 200 to 600 gf/cm$^2$.

3. The method according to claim 1, wherein the chemically mechanically polishing is executed by rotating the polishing head at a relative velocity of at most 1.06 m/sec. to the polishing pad.

4. The method according to claim 3, wherein the chemically mechanically polishing is executed by rotating the polishing head at a relative velocity of at least 0.17 m/sec. to the polishing pad.

5. The method according to claim 1, wherein the chemically mechanically polishing is executed by rotating the polishing head at a rotational speed ranging from 5 to 60 rpm.

6. The method according to claim 1, wherein the chemically mechanically polishing is executed by rotating the polishing pad at a rotational speed ranging from 10 to 50 rpm.

7. The method according to claim 1, wherein the slurry comprises resin particles.

8. The method according to claim 7, wherein the resin particles are made of a resin selected from the group consisting of methacrylic resin, polystyrene resin, urea resin, melamine resin, polyacetal resin and polycarbonate resin.

9. The method according to claim 7, wherein the resin particles are formed having a primary particle diameter ranging from 0.05 to 5 μm.

10. A method for manufacturing a semiconductor device comprising:
    forming a recess in a semiconductor substrate or in an insulating film deposited above the semiconductor substrate each employed as an underlying layer;
    forming a resist film above the underlying layer having the recess; and
    chemically mechanically polishing the resist film to selectively bury the resist film in the recess;
    wherein the chemically mechanically polishing of the resist film is performed by:
    repeating a sequence of rotation and halt of rotation of a polishing pad and a polishing head while feeding a slurry on the polishing pad, and press-contacting the semiconductor substrate held on the polishing head with the polishing pad, the semiconductor substrate having the resist film thereon, during repeating the sequence, the semiconductor substrate being kept press-contacted with the polishing pad.

11. The method according to claim 10, wherein the press-contacting the semiconductor substrate with the polishing pad is executed at a pressure ranging from 200 to 600 gf/cm$^2$.

12. The method according to claim 10, wherein the chemically mechanically polishing is executed by rotating the polishing head at a relative velocity of at most 1.06 m/sec. to the polishing pad.

13. The method according to claim 12, wherein the chemically mechanically polishing is executed by rotating the polishing head at a relative velocity of at least 0.17 m/sec. to the polishing pad.

14. The method according to claim 10, wherein the chemically mechanically polishing is executed by rotating the polishing head at a rotational speed ranging from 5 to 60 rpm.

15. The method according to claim 10, wherein the chemically mechanically polishing is executed by rotating the polishing pad at a rotational speed ranging from 10 to 50 rpm.

16. The method according to claim 10, wherein the slurry comprises resin particles.

17. The method according to claim 16, wherein the resin particles are made of a resin selected from the group consisting of methacrylic resin, polystyrene resin, urea resin, melamine resin, polyacetal resin and polycarbonate resin.

18. The method according to claim 16, wherein the resin particles are formed having a primary particle diameter ranging from 0.05 to 5 μm.

19. The method according to claim 16, wherein a primary particle diameter of the resin particles is 70% or more of a diameter of aperture of the recess.

20. The method according to claim 1, wherein a period of the rotation is less than 180 seconds.

* * * * *